United States Patent
Nakamura (10) Patent No.: US 9,337,757 B2
(45) Date of Patent: May 10, 2016

(54) MOTOR CONTROLLER

(71) Applicant: ALPS ELECTRIC CO., LTD., Ota-ku, Tokyo (JP)

(72) Inventor: Tokuo Nakamura, Tokyo (JP)

(73) Assignee: ALPS ELECTRIC CO., LTD., Tokyo (JP)

(*) Notice: Subject to any disclaimer, the term of this patent is extended or adjusted under 35 U.S.C. 154(b) by 48 days.

(21) Appl. No.: 14/325,800

(22) Filed: Jul. 8, 2014

(65) Prior Publication Data

US 2015/0061559 A1    Mar. 5, 2015

(30) Foreign Application Priority Data

Aug. 29, 2013   (JP) ................. 2013-178568

(51) Int. Cl.
| | |
|---|---|
| G01R 33/09 | (2006.01) |
| H02K 29/08 | (2006.01) |
| H02P 6/16 | (2016.01) |
| H02P 6/12 | (2006.01) |

(52) U.S. Cl.
CPC ........ H02P 6/16 (2013.01); G01R 33/09 (2013.01); H02P 6/12 (2013.01)

(58) Field of Classification Search
CPC ..................... H02P 6/00; H02P 6/16
USPC ........... 318/700, 400.01, 400.16, 400.37, 318/400.38
See application file for complete search history.

(56) References Cited

U.S. PATENT DOCUMENTS

| | | | | |
|---|---|---|---|---|
| 5,859,510 A | * | 1/1999 | Dolan ............... | H02P 6/001 318/400.08 |
| 6,744,230 B2 | * | 6/2004 | Hill ................. | G01P 3/48 318/400.04 |
| 7,714,529 B2 | * | 5/2010 | Chen ............... | H02P 25/023 318/400.38 |

FOREIGN PATENT DOCUMENTS

WO    WO 2012-102113    8/2012

* cited by examiner

*Primary Examiner* — Bentsu Ro
(74) *Attorney, Agent, or Firm* — Hunton & Williams LLP (57) ABSTRACT

The outputs from a first magnetic detector and a second magnetic detector are supplied to first to fourth output circuits which are differential amplifiers, whereby first and second detected outputs which are analogous to a sine wave and whose positive-negative polarities are opposite to each other, and third and fourth detected outputs which are analogous to a cosine wave and whose positive-negative polarities are opposite to each other are obtained. The first to fourth detected outputs are supplied to a switching circuit, and detected output portions are obtained at intervals of 90° from the first to fourth detected outputs. A bias adding circuit applies a bias voltage to each of the detected output portions to obtain an angle detection output analogous to a linear function. The angle detection output is used to determine the supply timing at which a three-phase driving current is supplied.

6 Claims, 8 Drawing Sheets

MOTOR CONTROLLER

CLAIM OF PRIORITY

This application contains subject matter related to and claims the benefit of Japanese Patent Application No. 2013-178568 filed on Aug. 29, 2013, the entire contents of which is incorporated herein by reference.

BACKGROUND OF THE DISCLOSURE

1. Field of the Disclosure

The present disclosure relates to a motor controller which controls three-phase driving power by using an analog output which is analogous to a linear function that is proportional to the rotation angle of a rotation shaft.

2. Description of the Related Art

In motor controllers which control a three-phase motor, three-phase driving power for the phase U, the phase V, and the phase W is supplied to motor coils in accordance with the rotation phase of a motor.

In a motor controller described in WO2012/102113 A1, an arithmetic processing unit calculates a motor control signal, and a logic circuit supplied with the motor control signal calculates a driving signal for each of the phases of the three-phase motor. A pre-driver circuit is controlled on the basis of the driving signal, and the three-phase motor is controlled.

The motor controller described in WO2012/102113 A1 generates a driving signal for driving the three-phase motor, through digital calculation, resulting in a complicated circuit configuration. In addition, the digital calculation takes time. Accordingly, when the motor rotates at high speed, there arises a problem in that the digital calculation fails to be performed at a speed in line with the rotational speed.

These and other drawbacks exist.

SUMMARY OF THE DISCLOSURE

The present disclosure provides a motor controller which enables three-phase driving power to be switched by using an analog output obtained by using a simple circuit configuration, and which enables the switching to be performed at a speed in line with high-speed rotation.

The present disclosure provides a motor controller including a motor driver and an angle detection device. The motor driver supplies three-phase driving power to a motor coil. The angle detection device detects a rotation angle of a rotation shaft. The angle detection device includes a rotating magnetic field, a first magnetic detector, a second magnetic detector, and an analog mixer. The rotating magnetic field is formed in accordance with the rotation of the rotation shaft. The first magnetic detector obtains a detected output analogous to a sine wave which is a rotation angle function for the rotating magnetic field. The second magnetic detector obtains a detected output analogous to a cosine wave. The analog mixer forms an angle detection output analogous to a linear function from the detected output analogous to the sine wave and from the detected output analogous to the cosine wave. The angle detection output is analog. The motor driver includes a division detecting unit and a driving circuit. The division detecting unit detects a 120° rotation angle of the rotation shaft from the angle detection output. The driving circuit supplies the three-phase driving power to the motor coil in accordance with a timing at which the division detecting unit detects a dividing signal at every 120°.

The motor controller provided by embodiments of the present disclosure uses the angle detection output which is analog and which is obtained on the basis of the detected outputs from the first magnetic detector and the second magnetic detector, or uses the angle detection output which is analog and which is obtained through gain adjustment so as to switch the three-phase driving power at every 120° of rotation of the rotation shaft. Therefore, the circuit configuration is simple. Even when the rotational speed of the rotation shaft is high, the three-phase driving power can be generated at a speed in line with the rotational speed.

In a motor controller according to the present disclosure, the motor driver further includes a pulse control circuit that changes a duty ratio of the three-phase driving power on the basis of the angle detection output.

By changing the duty ratio of the three-phase driving power, upon switching to any of the phases, ripples in the rotation driving torque may be decreased. In addition, the angle detection output which is analog is used to directly control the three-phase power, making the circuit configuration simple and enabling the rotation shaft to rotate smoothly.

In the angle detection device according to the present disclosure, the analog mixer includes a switching circuit and a bias adding circuit. The switching circuit cuts out detected output portions analogous to a linear function from the detected outputs obtained from the first magnetic detector and the second magnetic detector. The detected outputs is analog. The bias adding circuit connects the detected output portions to each other by supplying bias power to any of the detected output portions, so as to use the result as the angle detection output.

By providing the switching circuit and the bias adding circuit, the angle detection output which is analog and which is continuous in the angle range of 360° can be generated.

In the angle detection device in the present disclosure, the angle detection device further includes first output circuits, second output circuits, and comparators. The first output circuits obtain a first detected output and a second detected output from the first magnetic detector. The second detected output is an output whose positive-negative polarity is opposite to a polarity of the first detected output. The second output circuits obtain a third detected output and a fourth detected output from the second magnetic detector. The fourth detected output is an output whose positive-negative polarity is opposite to a polarity of the third detected output. The comparators compare any of the first, second, third, and fourth detected outputs with another. A timing at which the switching circuit performs switching is determined on the basis of the comparison results from the comparators.

For example, the switching circuit allows each of the first, second, third, and fourth detected outputs to be cut out in a corresponding period of approximately 90°, whereby the detected output portions are obtained. In this case, each of the first, second, third, and fourth detected outputs is cut out in a range from approximately −45° to +45° with respect to the midpoint of the amplitude.

In the angle detection device in the present disclosure, each of the first magnetic detector and the second magnetic detector includes a bridge circuit including magnetoresistive effect devices. A direction of a sensing axis of a first magnetoresistive effect device included in the first magnetic detector is orthogonal to a direction of a sensing axis of a second magnetoresistive effect device included in the second magnetic detector.

In the motor controller provided by embodiments of the present disclosure, the angle detection output which is analog is generated. By using the angle detection output, timings corresponding to intervals of 120° are obtained to switch the three-phase driving power. Therefore, the circuit configuration may be simple. Complicated calculation is not necessary. Therefore, even when the rotational speed of the rotation shaft is high, the angle detection output may be obtained at a speed in line with the rotational speed of the rotation shaft, enabling the three-phase driving power to be controlled with high accuracy.

DESCRIPTION OF THE PREFERRED EMBODIMENTS

The following description is intended to convey a thorough understanding of the embodiments described by providing a number of specific embodiments and details involving a motor controller. It should be appreciated, however, that the present invention is not limited to these specific embodiments and details, which are exemplary only. It is further understood that one possessing ordinary skill in the art, in light of known systems and methods, would appreciate the use of the invention for its intended purposes and benefits in any number of alternative embodiments, depending on specific design and other needs.

Figure 1:
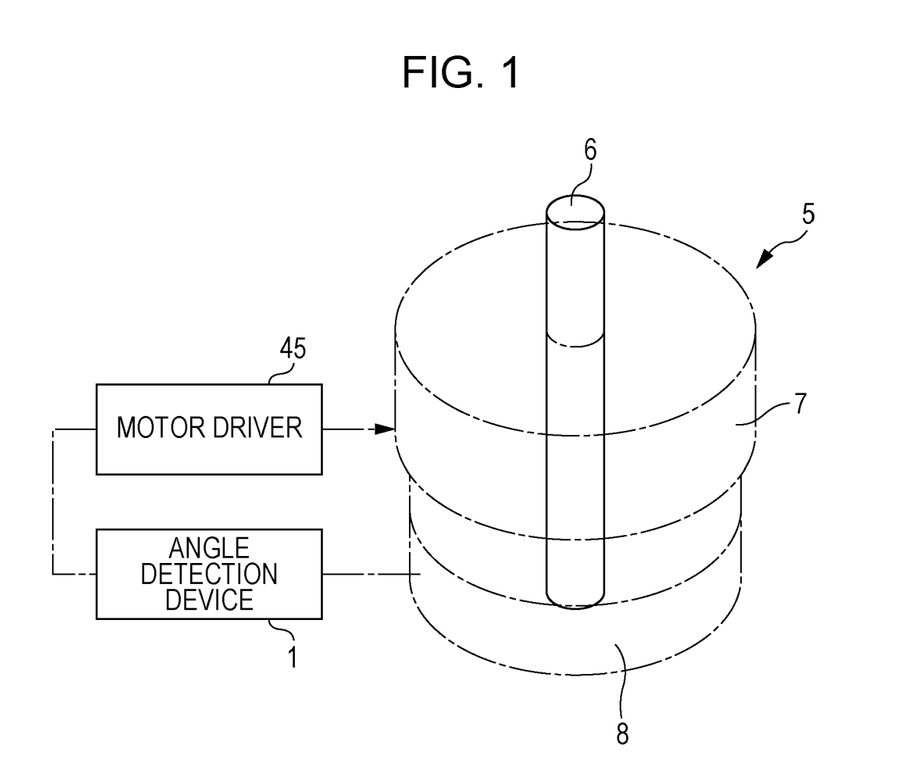
FIG. 1 is an external view of a motor controller according to an embodiment of the present disclosure.

A motor controller 5 illustrated in FIG. 1 may include a rotation shaft 6, a rotation driving unit 7 which may drive the rotation shaft 6, and a rotation detection unit 8 which may detect rotation of the rotation shaft 6.

Figure 8:
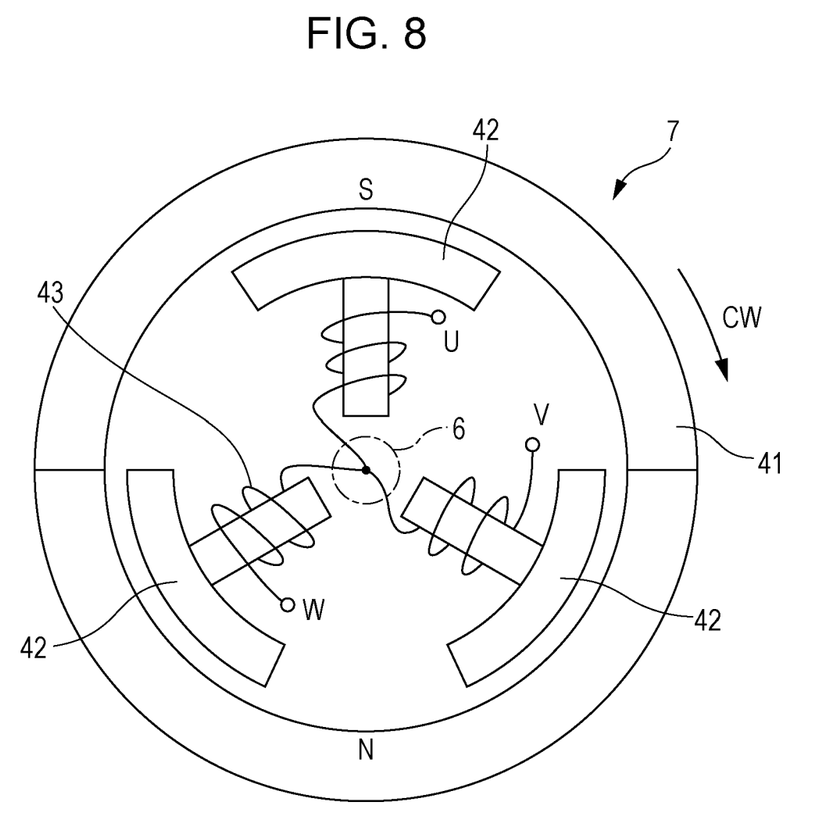
FIG. 8 is a diagram for describing a rotation driving unit of a three-phase motor according to an embodiment of the disclosure.

As illustrated in FIG. 8, the rotation driving unit 7 may constitute a driving unit of a brushless motor, and includes a rotor magnet 41 which may rotate with the rotation shaft 6. Three-phase stator yokes 42 may be disposed inside the rotor magnet 41 at angular intervals of 120° in the rotation direction, and each of the stator yokes 42 is connected to a corresponding one of motor coils 43 for the phase U, the phase V, and the phase W.

The rotation detection unit 8 may constitute a part of an angle detection device 1. An angle detection output obtained from the angle detection device 1 may control a motor driver 45, and three-phase driving power may be supplied from the motor driver 45 to the motor coils 43.

Figure 2:
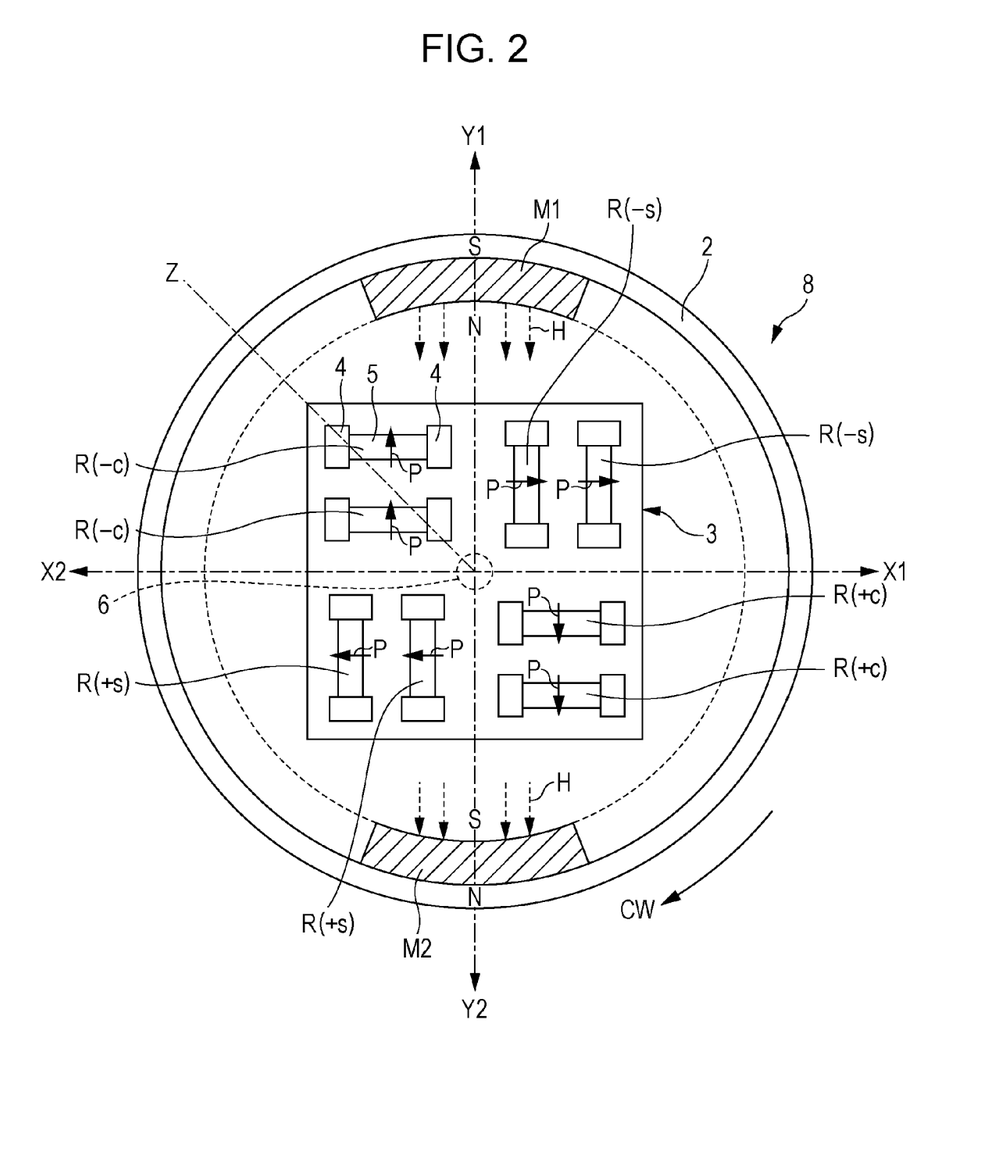
FIG. 2 is a plan view of the configuration of a rotation detection unit included in the motor controller according to an embodiment of the disclosure.

As illustrated in FIG. 2, the rotation detection unit 8 included in the motor controller 5 may include a rotor 2 which may rotate with the rotation shaft 6 of the motor. A detection substrate 3 may be fixed on the stator side inside the rotor 2.

Two magnets M1 and M2 may be fixed at angular intervals of 180° in the rotor 2. The north pole of the magnet M1 faces the magnet M2, and the south pole of the magnet M2 faces the magnet M1. A magnetic field H may be formed in the direction from the magnet M1 to the magnet M2.

The rotor 2 may rotate in the clockwise direction (CW) with the rotation shaft 6 of the motor. As a result, a rotating magnetic field in which the magnetic field H rotates in the clockwise direction may be formed inside the rotor 2.

First magnetoresistive effect devices R(+s) and R(−s) and second magnetoresistive effect devices R(+c) and R(−c) may be mounted as magnetic detection devices on the detection substrate 3. In FIG. 2, the detection substrate 3 and the magnetoresistive effect devices are illustrated as large components, but the actual detection substrate 3 and the actual magnetoresistive effect devices may have extremely small dimensions compared with the diameter of the rotation path of the magnets M1 and M2. During rotation of the rotor 2, to each of the magnetoresistive effect devices on the detection substrate 3, a rotating magnetic field in the same direction may be applied.

Also, the magnets M1 and M2 may be fixed on the stator side, and the detection substrate 3 may rotate with the rotation shaft 6.

The sensing axis P of the first magnetoresistive effect devices R(+s) and R(−s) may be orthogonal to that of the second magnetoresistive effect devices R(+c) and R(−c). Two types of first magnetoresistive effect devices may be provided: the R(+s) whose sensing axis P goes in the X2 direction, and the R(−s) whose sensing axis P goes in the X1 direction. Two types of second magnetoresistive effect devices may be provided: the R(+c) whose sensing axis P goes in the Y2 direction, and the R(−c) whose sensing axis P goes in the Y1 direction.

Each of the magnetoresistive effect devices may be a giant magnetoresistive (GMR) device using a giant magnetoresistance effect, a tunneling magnetoresistive (TMR) device using a tunnel effect, or an anisotropic magnetoresistive (AMR) device.

As illustrated in FIG. 2, a magnetoresistive effect device may include electrode portions 4 and an element portion 5 disposed between the electrode portions 4. The element portion 5 may be formed in a meander pattern in the X-Y plane, and may have a multilayer structure of pinned magnetic layer/non-magnetic layer/free magnetic layer. The pinned magnetization direction of the pinned magnetic layer may match the sensing axis P. The magnetization direction of the free magnetic layer may be changed in accordance with the direction of the external magnetic field H.

The electric resistance of the magnetoresistive effect device may be changed in accordance with a relative angle of the pinned magnetization direction relative to the magnetization direction of the free magnetic layer. When the external magnetic field H is applied in the sensing axis P direction, the electric resistance value of the magnetoresistive effect device may be the minimum value. When the external magnetic field H is applied in the direction opposite to the sensing axis P, the electric resistance value may be the maximum value. When the external magnetic field H is applied in the direction orthogonal to the sensing axis P, the electric resistance value of the magnetoresistive effect device may be the midpoint value.

The magnetization direction of the pinned magnetic layer may be fixed by subjecting a multilayer structure including the pinned magnetic layer and the antiferromagnetic layer to heat treatment in a magnetic field. Also, the pinned magnetic layer may have a synthetic ferrimagnetic structure of magnetic layer/non-magnetic intermediate layer/magnetic layer, which may be self-pinned so that magnetization of the magnetic layers is fixed in an anti-parallel manner. In this case, the magnetization may be fixed by forming one of the magnetic layers in a magnetic field.

Figure 3:
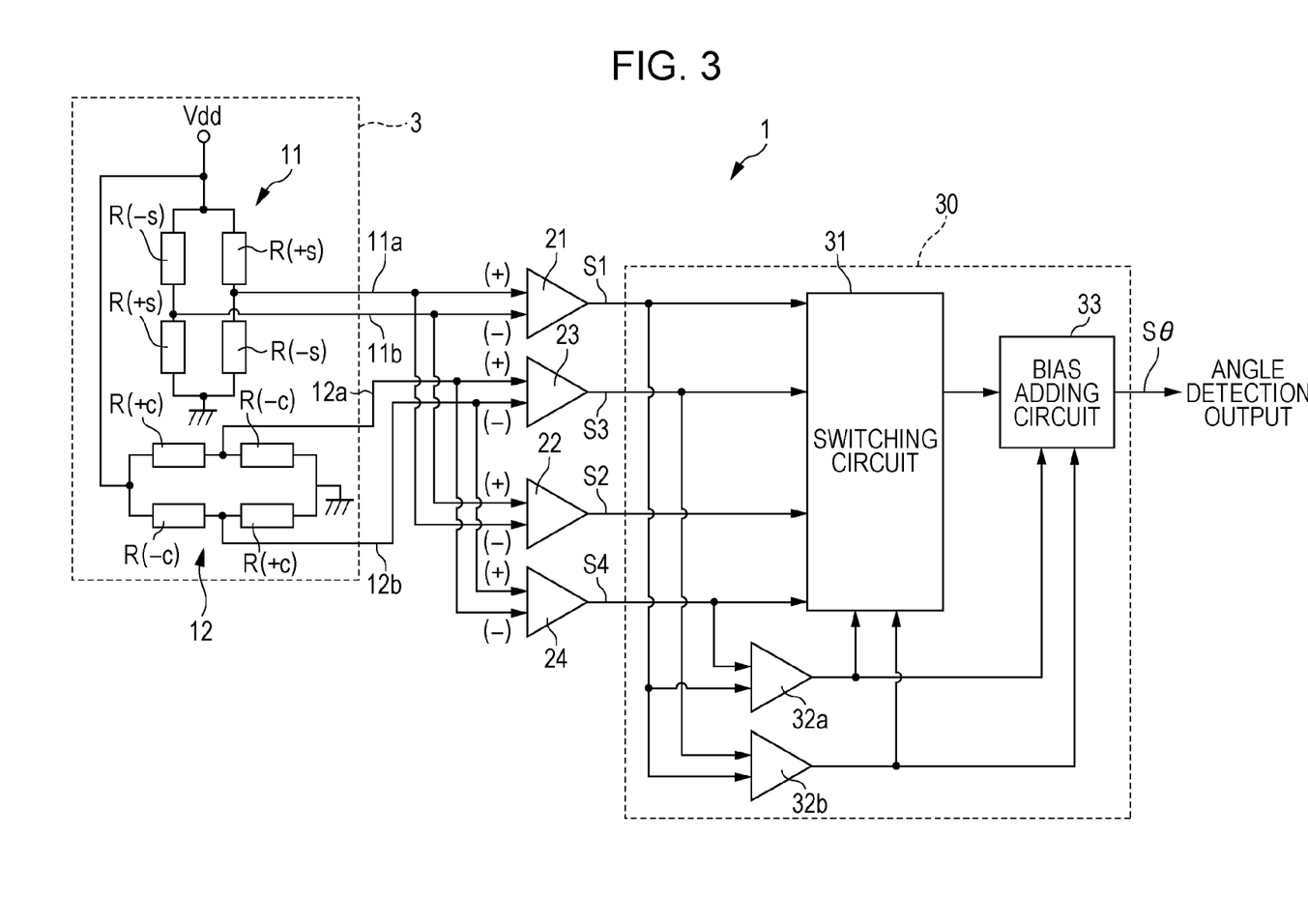
FIG. 3 is a circuit block diagram illustrating the circuit configuration of an angle detection device according to an embodiment of the disclosure.

As illustrated in FIG. 3, in the angle detection device 1, a first magnetic detector 11 and a second magnetic detector 12 may be formed on the detection substrate 3.

The first magnetic detector 11 may be a full-bridge circuit including the first magnetoresistive effect devices R(+s) and R(−s) in which the direction of the sensing axis P of the first magnetoresistive effect devices R(+s) is opposite to that of the first magnetoresistive effect devices R(−s). The second magnetic detector 12 may be a full-bridge circuit including the second magnetoresistive effect devices R(+c) and R(−c) in which the direction of the sensing axis P of the second magnetoresistive effect devices R(+c) is opposite to that of the second magnetoresistive effect devices R(−c).

As illustrated in FIG. 3, midpoint outputs (midpoint output voltages) 11a and 11b from the full-bridge circuit of the first magnetic detector 11 may be supplied to a first output circuit 21 and a second output circuit 22. The first output circuit 21 may be a differential amplifier having a (+) input unit connected to the midpoint output 11a and a (−) input unit connected to the midpoint output 11b. The second output circuit 22 also may be a differential amplifier having a (+) input unit connected to the midpoint output 11b and a (−) input unit connected to the midpoint output 11a.

Midpoint outputs (midpoint output voltages) 12a and 12b from the full-bridge circuit of the second magnetic detector 12 may be supplied to a third output circuit 23 and a fourth output circuit 24. The third output circuit 23 may be a differential amplifier having a (+) input unit connected to the midpoint output 12a and a (−) input unit connected to the midpoint output 12b. The fourth output circuit 24 is also a differential amplifier having a (+) input unit connected to the midpoint output 12b and a (−) input unit connected to the midpoint output 12a.

When the rotor 2 illustrated in FIG. 2 rotates in the clockwise direction (CW), a first detected output S1 may be obtained from the first output circuit 21, and a second detected output S2 may be obtained from the second output circuit 22. A third detected output S3 may be obtained from the third output circuit 23, and a fourth detected output S4 may be obtained from the fourth output circuit 24.

Figure 4:
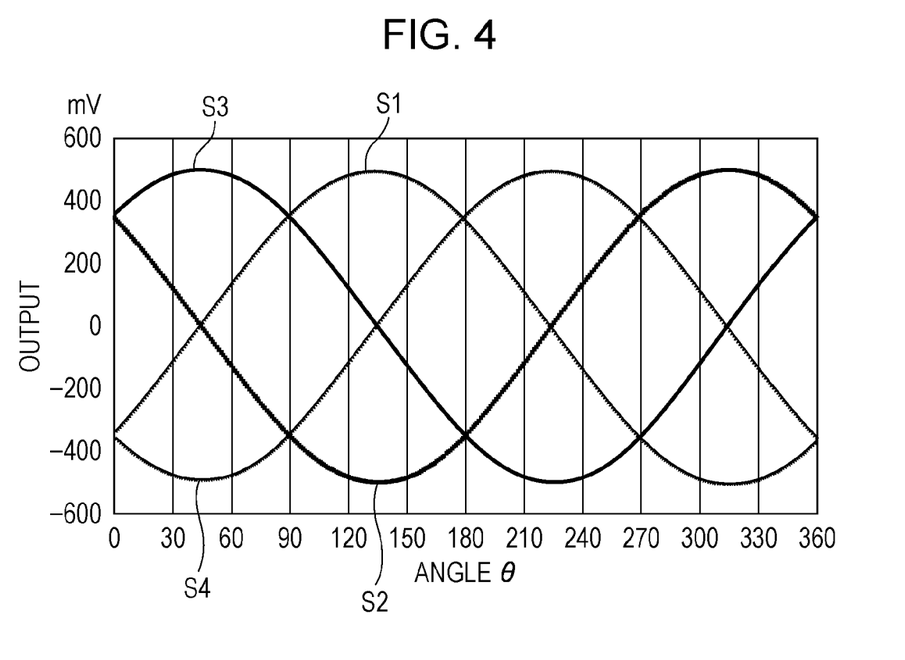
FIG. 4 is a diagram illustrating four types of detected output obtained from first and second magnetic detectors according to an embodiment of the disclosure.

FIG. 4 illustrates the output waveforms of the first to fourth detected outputs S1 to S4. The horizontal axis represents a rotation angle (θ), and the vertical axis represents output intensity (voltage).

The polarity (positive or negative voltage) of the first detected output S1 may be opposite to that of the second detected output S2. The polarity of the third detected output S3 may be opposite to that of the fourth detected output S4. The phase of the first detected output S1 may be different from that of the third detected output S3 by 90°, and the phase of the second detected output S2 is also different from that of the fourth detected output S4 by 90°. One of the first detected output S1 and the third detected output S3 may be an output which changes in a manner analogous to a trigonometric function wave which is a sine wave, and the other may be an output which changes in a manner analogous to a trigonometric function wave which is a cosine wave.

The horizontal axis in FIG. 4 represents the rotation angle θ of the rotor 2. In this representation of the rotation angle θ, the origin(0° represents the state in which the center of the width of the magnet M1 illustrated in FIG. 2 is positioned on the reference line Z. FIG. 2 illustrates the state in which the magnet M1 of the rotor 2 which is rotating has moved from the origin (reference axis Z) by 45° in the clockwise direction (CW). The output intensities of the first to fourth detected outputs S1 to S4 at that time are the output intensities plotted at the 45° mark on the horizontal axis in FIG. 4. At the 45° mark on the horizontal axis, the output intensity of the first detected output S1 and that of the second detected output S2 have the midpoint value; the output intensity of the third detected output S3 has the maximum value; and the output intensity of the fourth detected output S4 has the minimum value.

The amplitudes and the absolute values of the intensities of the output waveforms of the first to fourth detected outputs S1 to S4 illustrated in FIG. 4 depend on the power supply voltage Vdd, gains which are set for the output circuits 21, 22, 23, and 24 which are differential amplifiers, and the like. The first to fourth detected outputs S1 to S4 are analog outputs in which changes in the detected outputs from the first magnetic detector 11 and the second magnetic detector 12 which detect the rotating magnetic field are reflected as they are.

As illustrated in FIG. 3, the first to fourth detected outputs S1 to S4 may be supplied to an analog mixer 30. The analog mixer 30 may include a switching circuit 31, comparators 32a and 32b, and a bias adding circuit 33.

The first comparator 32a may compare the magnitudes of the intensities of the first detected output S1 and the fourth detected output S4 with each other, and the result may be supplied to the switching circuit 31. The second comparator 32b may compare the magnitudes of the intensities of the first detected output S1 and the third detected output S3 with each other, and the result may be supplied to the switching circuit 31.

The switching circuit 31 may perform a switching operation on the basis of the comparison results from the comparators 32a and 32b, and any of the first to fourth detected outputs S1 to S4 is cut to obtain a detected output portion which is selected.

Table 1 describes the comparison result from the first comparator 32a, the comparison result from the second comparator 32b, and the detected output to be cut by the switching circuit 31 on the basis of these comparison results.

TABLE 1

| First comparator 32a | Second comparator 32b | Switching output (Detected output portion) | Bias voltage |
|---|---|---|---|
| S1 > S4 | S1 < S3 | S1 (S1c) | +350 mV |
| S1 > S4 | S1 > S3 | S4 (S4c) | +1050 mV |
| S1 < S4 | S1 > S3 | S2 (S2c) | +1750 mV |
| S1 < S4 | S1 < S3 | S3 (S3c) | +2450 mV |

Figure 5:
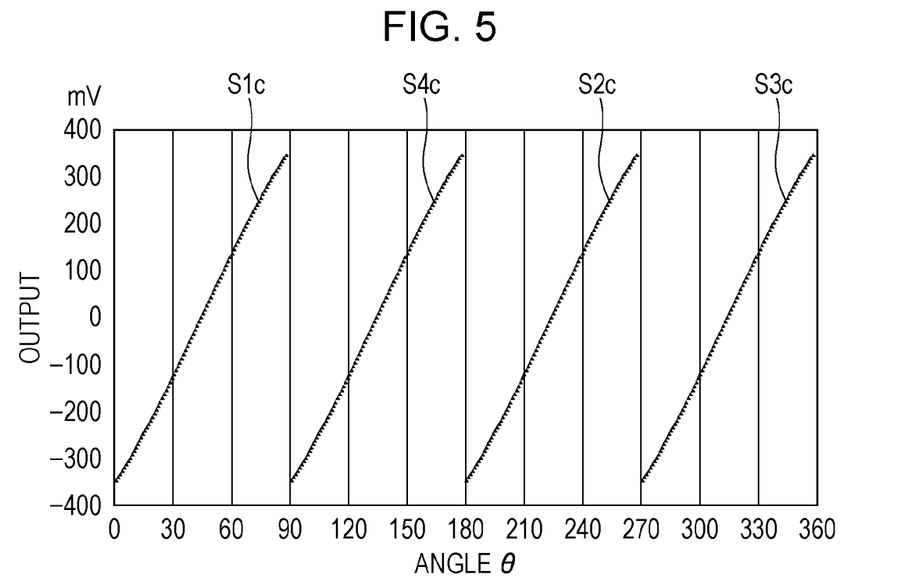
FIG. 5 is a diagram illustrating detected output portions obtained by cutting the detected outputs obtained from the first and second magnetic detectors according to an embodiment of the disclosure.

FIG. 5 illustrates detected output portions S1c, S4c, S2c, and S3c obtained through the cutting operation performed in the switching operation performed by the switching circuit 31.

As shown in Table 1, each of the first comparator 32a and the second comparator 32b compares two detected outputs with each other, and the switching circuit 31 performs the switching operation, whereby, as illustrated in FIG. 5, in the 360° rotation of the rotor 2 in the clockwise direction, four detected outputs are cut out at intervals of 90°.

In the range of the angle θ from approximately 0° to 90°, as shown in the first row in Table 1, the first detected output S1 in the range from approximately −45° to +45° with respect to the midpoint of its amplitude (voltage width) is cut out to obtain the detected output portion S1c illustrated in FIG. 5. In the range of the angle θ from approximately 90° to 180°, as shown in the second row in Table 1, the detected output S4 in the range from approximately −45° to +45° with respect to the midpoint of its amplitude (voltage width) is cut out to obtain the detected output portion S4c illustrated in FIG. 5. Similarly, in the range of the angle θ from approximately 180° to 270°, the detected output portion S2c is obtained. In the range of the angle θ from approximately 270° to 360°, the detected output portion S3c is obtained.

Since each of the detected output portions S1c, S4c, S2c, and S3c is cut out in the range from approximately −45° to +45° with respect to the midpoint of the amplitude from a corresponding one of the detected outputs which is analogous to a sine wave or a cosine wave, change in the output intensity approximately accords with a linear function.

The first comparator 32a and the second comparator 32b generate a signal for dividing the detected outputs at every 90° so that the detected output portions illustrated in FIG. 5 are obtained. As long as the detected output portions illustrated in FIG. 5 are obtained, the detected outputs to be compared with each other are not limited to the example shown in Table 1.

For example, even if the comparison condition is that S3>S1 and S3>S2, the first detected output S1 in the range of angle θ from 0° to 90° may be cut out, and the detected output portion S1c may be obtained.

Figure 6:
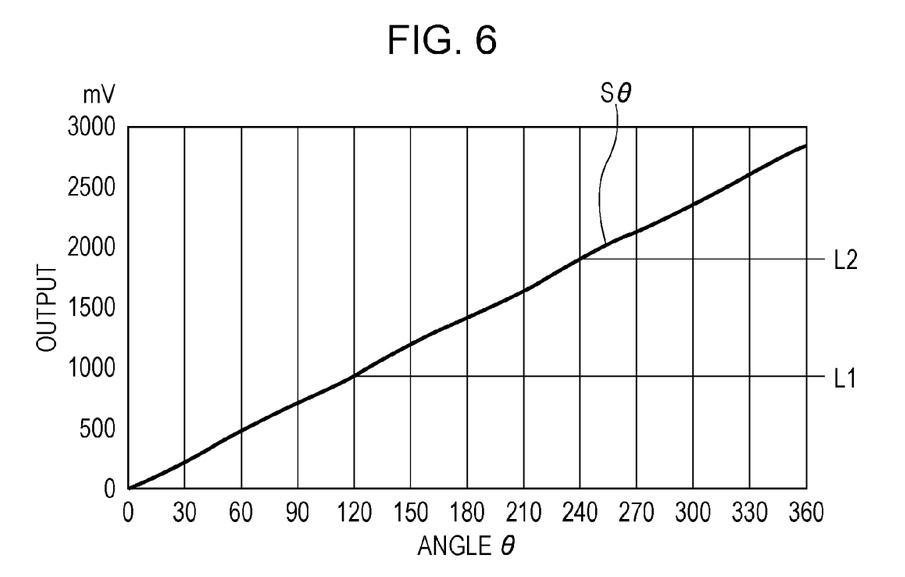
FIG. 6 is a diagram illustrating an angle detection output in which the detected output portions are connected to each other according to an embodiment of the disclosure.

The detected output portions S1c, S4c, S2c, and S3c which are cut out by the switching circuit 31 may be supplied to the bias adding circuit 33. In the bias adding circuit 33, each of the detected output portions S1c, S4c, S2c, and S3c may be supplied with a positive or negative bias voltage so that, as illustrated in FIG. 6, an angle detection output Sθ which is obtained by connecting the detected output portions S1c, S4c, S2c, and S3c to each other and which is analogous to a linear function is obtained. In the rightmost column in Table 1 illustrated above, bias voltage values supplied to the detected output portions S1c, S4c, S2c, and S3c in order to obtain the angle detection output illustrated in FIG. 6 are shown as numeric values.

The bias adding circuit may be constituted by, for example, a resistor and a variable resistor. A bias voltage may be applied to the detected output portion S4c in FIG. 5 so that the starting point of the detected output portion S4c is connected to the endpoint of the detected output portion S1c. Similarly, each of the detected output portions S2c and S3c may be supplied with a bias voltage. By supplying the detected output portion S1c, which is first obtained, with a positive or negative bias voltage, as illustrated in FIG. 6, the starting point of the output obtained when the angle θ is approximately 0° may match the zero point of the output voltage.

Figure 7:
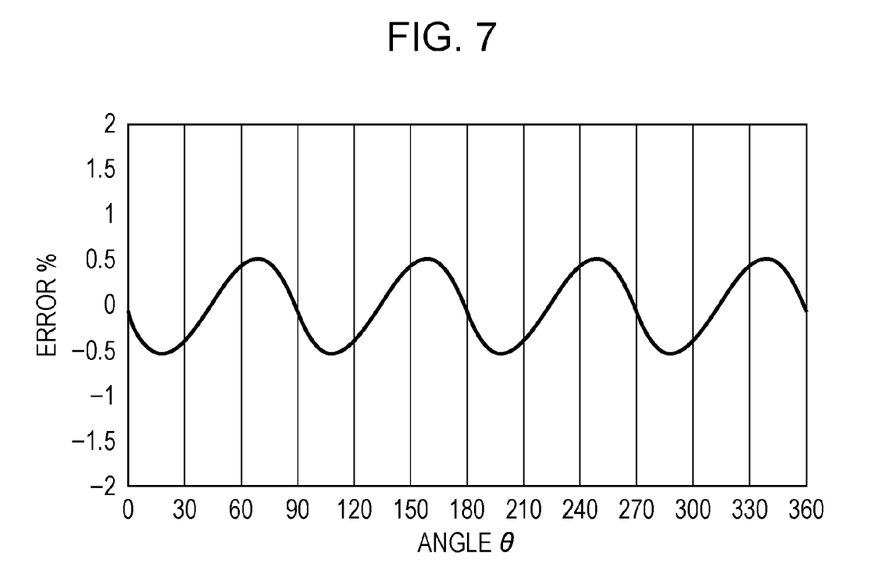
FIG. 7 is a diagram illustrating distribution of error occurring between the angle detection output illustrated in FIG. 6 and a linear function according to an embodiment of the disclosure.

A change in the angle detection output Sθ illustrated in FIG. 6 is analogous to a linear function. FIG. 7 illustrates intensity error occurring between the angle detection output illustrated in FIG. 6 and the linear function. The error in the angle detection output Sθ with respect to the linear function approximately ranges from −0.5% to +0.5%.

The angle detection device 1 according to the embodiment of the present disclosure uses an analog output obtained from the first magnetic detector 11 and the second magnetic detector 12 as they are or uses an analog output obtained through gain adjustment, whereby an angle detection output Sθ which is analogous to a linear function can be instantaneously obtained. Therefore, even when the rotor 2 which is directly coupled to the motor is rotating, a rotation angle can be accurately detected.

In the angle detection device 1 illustrated in FIGS. 2 and 3, the first magnetic detector 11 may be a full-bridge circuit including the first magnetoresistive effect devices R(+s) and R(−s), and the second magnetic detector 12 may be a full-bridge circuit including the second magnetoresistive effect devices R(+c) and R(−c).

Also, according to various embodiments, the first magnetic detector 11 may be a full-bridge circuit obtained by combining either type of the R(+s) and the R(−s) as the first magnetoresistive effect devices with fixed resistors, or may be a half-bridge circuit using either type of the R(+s) and the R(−s). The same holds true for the second magnetic detector 12.

In the analog mixer 30 illustrated in FIG. 3, the detected output portions which may be cut out by the switching circuit 31 are supplied with bias power. Also, the first to fourth detected outputs S1 to S4 which have been output from the first to fourth output circuits 21, 22, 23, and 24 are supplied with bias power in advance, and the switching circuit 31 then cuts out the detected output portions, enabling an angle detection output Sθ which is continuous to be obtained from the switching circuit 31.

Figure 9:
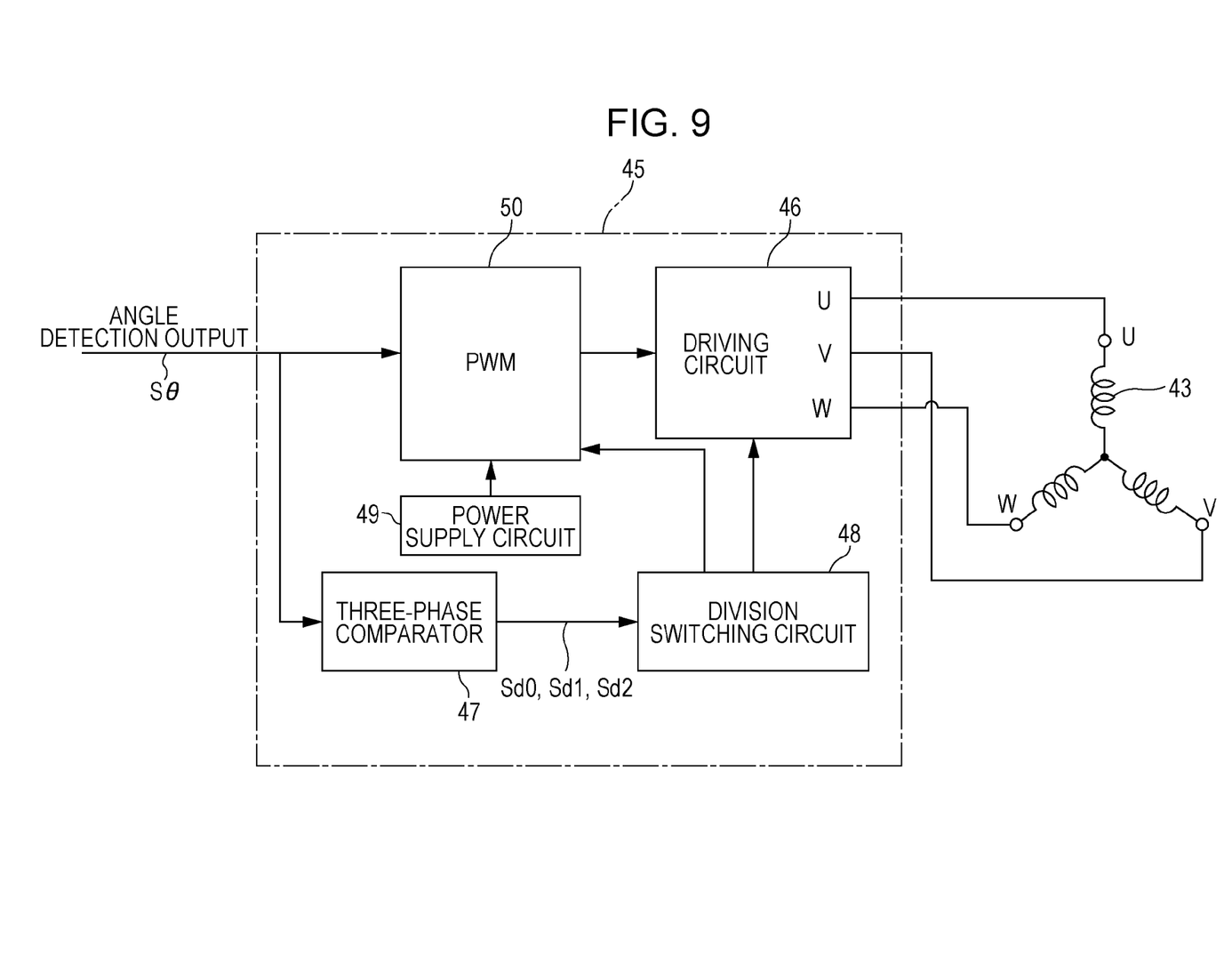
FIG. 9 is a diagram illustrating the circuit configuration of a motor driver according to an embodiment of the disclosure.

As illustrated in FIG. 9, the motor driver 45 includes a driving circuit 46, and three-phase driving power may be supplied from the driving circuit 46 to the motor coils 43.

The motor driver 45 may include a three-phase comparator 47, and the angle detection output Sθ generated in the angle detection device 1 illustrated in FIG. 3 may be supplied to the three-phase comparator 47. The three-phase comparator 47 may function as a division detecting unit, and may compare the angle detection output Sθ with two thresholds L1 and L2 illustrated in FIG. 6. The threshold L1 may be a voltage corresponding to the output intensity of the angle detection output Sθ obtained when the rotation angle θ of the rotation shaft 6 and the rotor 2 reaches approximately 120°. The threshold L2 is a voltage corresponding to the output intensity of the angle detection output Sθ obtained when the rotation angle θ of the rotation shaft 6 and the rotor 2 reaches approximately 240°.

A dividing signal may be supplied from the three-phase comparator 47 to the division switching circuit 48. When the intensity of the angle detection output Sθ which is output from the angle detection device 1 is equal to approximately zero, a dividing signal Sd0 may be supplied from the three-phase comparator 47 to the division switching circuit 48; when the angle detection output Sθ matches the threshold L1, a dividing signal Sd1 may be supplied; and when the intensity of the angle detection output Sθ matches the threshold L2, a dividing signal Sd2 may be supplied.

Figure 10:
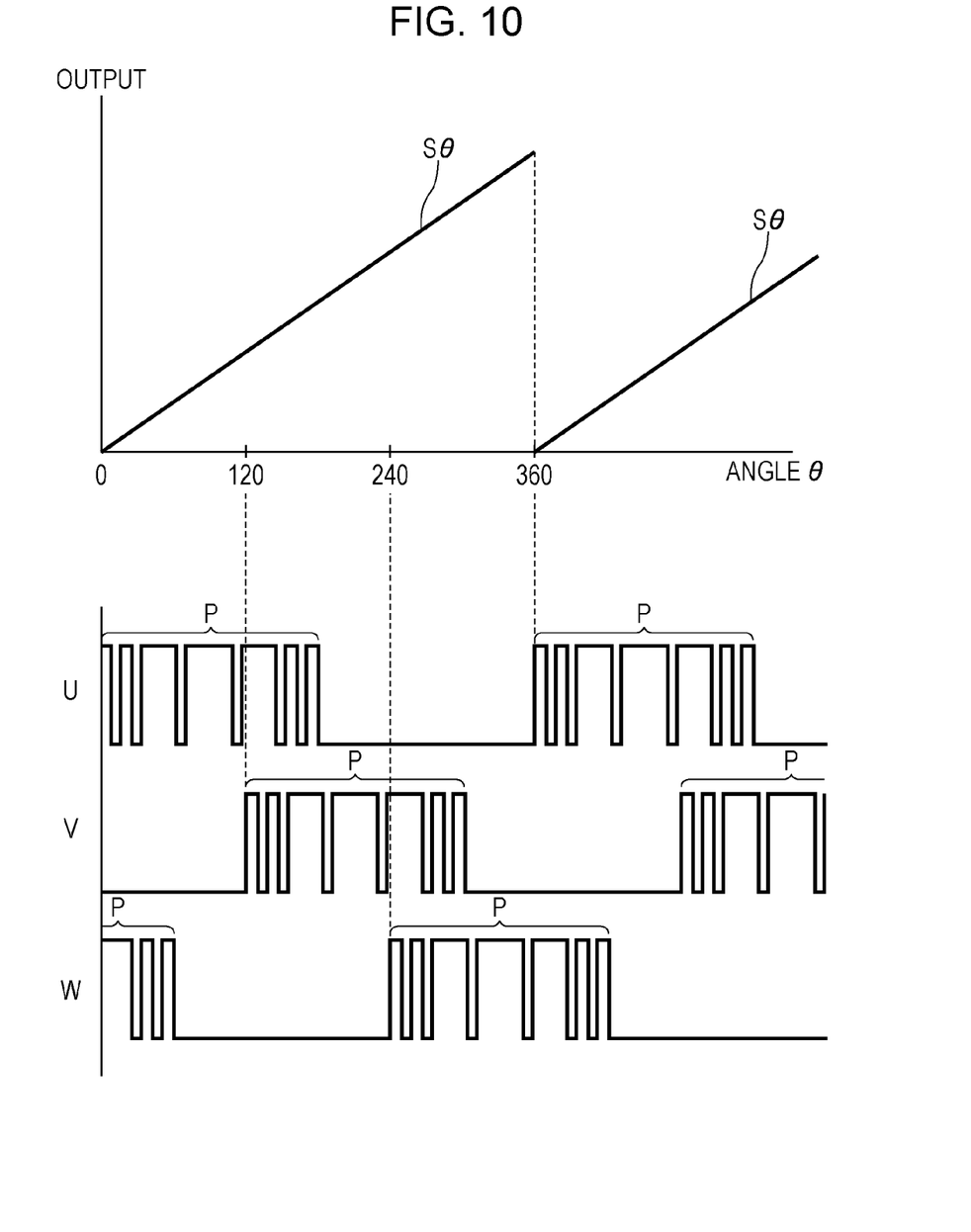
FIG. 10 is a diagram illustrating an angle detection output and three-phase driving power according to an embodiment of the disclosure.

When the dividing signal Sd0, Sd1, or Sd2 is supplied to the division switching circuit 48, the division switching circuit 48 may cause the supply timing of driving power supplied from the driving circuit 46 to the motor coils 43 to be switched. As illustrated in FIG. 10, when the dividing signal Sd0 is supplied from the three-phase comparator 47 to the division switching circuit 48, the driving circuit 46 sets a supply period which has a time width of approximately 180° and in which phase-U driving power is supplied, for the motor coils 43. When the dividing signal Sd1 is supplied, a supply period which has a time width of approximately 180° and in which phase-V driving power is supplied is set for the motor coils 43. When the dividing signal Sd2 is supplied, a supply period which has a time width of approximately 180° and in which phase-W driving power is supplied is set for the motor coils 43.

In the motor driver 45 illustrated in FIG. 9, the angle detection output Sθ illustrated in FIG. 6 may be supplied to a pulse-width modulation circuit (pulse control circuit) 50. The duty ratio of the motor driving power supplied from a power supply circuit 49 may be changed by the pulse-width modulation circuit 50, and the motor driving power may be supplied to the driving circuit 46.

The pulse-width modulation circuit 50 may detect angle change (time change) in the supply period for the phase-U driving power by referring to the angle detection output Sθ. Power may be adjusted so that the driving power is decreased at the beginning of the phase-U supply period, is then increased, and is further decreased. This driving power may be subjected to analog-digital conversion. As a result, through the switching performed by the division switching circuit 48, the phase-U driving power which is supplied from the driving circuit 46 to the motor coils 43 forms pulse group P power as illustrated in FIG. 10. The duty ratio of the power supply may become large at the middle of the supply period, and may become small before and after the middle of the supply period. The pulse group P may be generated in a similar manner in all of supply periods for the phase-U driving power. Similarly, the pulse-width modulation circuit 50 may control the duty ratio of the power supply in a supply period for the phase-V driving power and a supply period for the phase-W driving power.

The phase-U driving power, the phase-V driving power, and the phase-W driving power may be supplied to the motor coils 43, causing the rotor magnet 41 to rotate in the clockwise direction (CW). The phase-U driving power, the phase-V driving power, and the phase-W driving power which may be switched to each other at every 120° are supplied in the form of a pulse group P. In a supply period for each type of driving power, the substantial current amount gradually increases and gradually decreases. Therefore, ripples produced when the driving power for each of the phases is switched to another can be reduced.

In the motor controller 5, the angle detection output Sθ which may be an analog output may be supplied to the three-phase comparator 47, and a dividing signal may be supplied to the division switching circuit 48, whereby the supply timings and the supply periods for the phase-U driving power, the phase-V driving power, and the phase-W driving power are determined as illustrated in FIG. 10. The supply timings occur at approximately every 120°, and the supply periods have a time width of approximately 180°. In a supply period for the driving power of each phase, a change in the absolute angle of the angle detection output Sθ (angle of inclination of the angle detection output Sθ illustrated in FIG. 6) is referred to, and the duty ratio of the driving power in the middle portion of the supply period may be made different from those in the portions before and after the middle portion. This control achieves motor rotation having no ripples.

The motor controller controls the driving power of each of the three phases by using the angle detection output Sθ which has analog values and which is generated from the detected outputs from the magnetoresistive effect devices. Therefore, even when the rotation shaft 6 rotates at high rotational speed, the motor controller can control the rotation at a speed in line with the high-speed rotation.

Accordingly, the embodiments of the present inventions are not to be limited in scope by the specific embodiments described herein. Further, although some of the embodiments of the present disclosure have been described herein in the context of a particular implementation in a particular environment for a particular purpose, those of ordinary skill in the art should recognize that its usefulness is not limited thereto and that the embodiments of the present inventions can be beneficially implemented in any number of environments for any number of purposes. Accordingly, the claims set forth below should be construed in view of the full breadth and spirit of the embodiments of the present inventions as disclosed herein. While the foregoing description includes many details and specificities, it is to be understood that these have been included for purposes of explanation only, and are not to be interpreted as limitations of the invention. Many modifications to the embodiments described above can be made without departing from the spirit and scope of the invention.

What is claimed is:

1. A motor controller comprising:
   a motor driver that supplies three-phase driving power to a motor coil; and
   an angle detection device that detects a rotation angle of a rotation shaft,
   wherein the angle detection device includes
      a rotating magnetic field that is formed in accordance with the rotation of the rotation shaft,
      a first magnetic detector that obtains a detected output analogous to a sine wave which is a rotation angle function for the rotating magnetic field,
      a second magnetic detector that obtains a detected output analogous to a cosine wave, and
      an analog mixer that forms an angle detection output analogous to a linear function from the detected output analogous to the sine wave and from the detected output analogous to the cosine wave, the angle detection output being analog, and
   wherein the motor driver includes
      a division detecting unit that detects a 120° rotation angle of the rotation shaft from the angle detection output, and
      a driving circuit that supplies the three-phase driving power to the motor coil in accordance with a timing at which the division detecting unit detects a dividing signal at every 120°, and
   wherein the analog mixer includes
      a switching circuit that cuts out a plurality of detected output portions analogous to a linear function from the detected outputs obtained from the first magnetic detector and the second magnetic detector, the detected outputs being analog, and
      a bias adding circuit that connects the plurality of detected output portions to each other by supplying bias power to any of the plurality of detected output portions, so as to use the result as the angle detection output.

2. The motor controller according to claim 1, wherein the motor driver further includes a pulse control circuit that changes a duty ratio of the three-phase driving power on the basis of the angle detection output.

3. The angle detection device according to claim 1, further comprising:
   output circuits that obtain a first detected output and a second detected output from the first magnetic detector, the second detected output being an output whose positive-negative polarity is opposite to a polarity of the first detected output;
   output circuits that obtain a third detected output and a fourth detected output from the second magnetic detector, the fourth detected output being an output whose positive-negative polarity is opposite to a polarity of the third detected output; and comparators that compare any of the first, second, third, and fourth detected outputs with another, wherein a timing at which the switching circuit performs switching is determined on the basis of the comparison results from the comparators.

4. The angle detection device according to claim 3, wherein the switching circuit allows each of the first, second, third, and fourth detected outputs to be cut out in a 90° period so as to obtain the detected output portion.

5. The angle detection device according to claim 4, wherein each of the first, second, third, and fourth detected outputs is cut out in a range from −45° to +45° with respect to the midpoint of an amplitude of the detected output.

6. The angle detection device according to claim 1, wherein each of the first magnetic detector and the second magnetic detector includes a bridge circuit including magnetoresistive effect devices, and wherein a direction of a sensing axis of a first magnetoresistive effect device included in the first magnetic detector is orthogonal to a direction of a sensing axis of a second magnetoresistive effect device included in the second magnetic detector.

* * * * *